United States Patent [19]

Takemae

[11] Patent Number: 5,568,427
[45] Date of Patent: Oct. 22, 1996

[54] MEMORY AND METHOD OF READING OUT OF THE MEMORY

[75] Inventor: Yoshihiro Takemae, Kawasaki, Japan

[73] Assignee: Fujitsu Limited, Kawasaki, Japan

[21] Appl. No.: 433,255

[22] Filed: May 2, 1995

[30] Foreign Application Priority Data

Jul. 14, 1994 [JP] Japan .................................. 6-161907

[51] Int. Cl.⁶ ................................ G11C 7/00; G11C 8/00
[52] U.S. Cl. ................................ 365/189.02; 365/230.02; 365/230.03; 365/233; 365/236; 365/239
[58] Field of Search .......................... 365/189.02, 203, 365/205, 207, 208, 230.02, 230.03, 230.04, 230.05, 230.06, 230.08, 233, 236, 239

[56] References Cited

U.S. PATENT DOCUMENTS

| | | | |
|---|---|---|---|
| 4,847,809 | 7/1989 | Suzuki | 365/189.04 |
| 5,051,955 | 9/1991 | Kobayashi | 365/189.02 |
| 5,093,808 | 3/1992 | Foss | 365/203 |
| 5,220,527 | 6/1993 | Ohsawa | 365/207 |
| 5,241,503 | 8/1993 | Cheng | 365/205 |
| 5,398,209 | 3/1995 | Iwakiri et al. | 365/230.03 |
| 5,457,657 | 10/1995 | Suh | 365/205 |

Primary Examiner—David C. Nelms
Assistant Examiner—Trong Phan
Attorney, Agent, or Firm—Armstrong, Westerman, Hattori, McLeland & Naughton

[57] ABSTRACT

A memory and a method for reading out of memory including a register for holding one row of data of a memory cell array, a plurality of first switching transistors for switching ON/OFF between a plurality of bit lines and the corresponding bits in the register, a plurality of second switching transistors for switching ON/OFF between the bit lines and a pair of data bus lines and a plurality of third switching transistors for switching ON/OFF between the data bus lines and the bits in the register. In random access of memory cells, selection and control is performed for the plurality of second switching transistors with an output of a column decoder. In sequential reading out of the register, one row data of the memory cells selected by a row decoder are written in the register by controlling the plurality of first switching transistors and with an output of the column decoder, sequential selection and control of the plurality of third switching transistors is performed.

9 Claims, 5 Drawing Sheets

5,568,427

MEMORY AND METHOD OF READING OUT OF THE MEMORY

BACKGROUND OF THE INVENTION

1. Field of the Invention

The present invention relates to a memory and a method of reading data out of the memory.

2. Description of the Related Art

Compared with a DRAM (Dynamic Random Access Memory), a VRAM (Video RAM) is provided with, in addition to a regular random access circuit a sequential access circuit whose chip area is relatively large, and the number of input/output terminals in the VRAM is about twice that of ordinary DRAM. As a result, the price of VRAM is also about twice that of ordinary DRAM.

Synchronous DRAM, as shown in FIG. 4, has been developed to cope with the ever higher speeds of system clocks in microprocessors.

A synchronous DRAM performs latching of commands and input/output of data in synchronization with the rising edge of a clock pulse CLK which is externally provided. The time required by synchronous DRAM to access the first data is approximately the same as that of asynchronous type DRAM, but it can read out second data and subsequent data in clock units at high speed. It is also provided with a memory cell array 10 of bank 0 and a memory cell array 20 of bank 1, and by reading, for instance, every four words out of the memory cell array 10 and the memory cell array 20 alternately, the precharge time can be hidden and access can be performed continuously even when the row addresses are different. Synchronous DRAM has less chip area than VRAM and is, therefore, cheaper.

It follows that there is demand for such synchronous DRAM to be used in typical VRAM applications.

However, in case that, while data are continuously read out of the memory cell array 10 and the data are being converted to video signals, other data are also read out of another address in the memory cell array 10 by an image processing application program to overwrite the contents of the memory cell array 10 in correspondence to the value of that other data, data cannot be read alternately out of the memory cell array 10 and the memory cell array 20. Consequently, as shown in FIG. 5, continuous data access cannot be performed, generating wasted time.

Specific explanation is given as to how this problem occurs in reference to FIG. 5. FIG. 5 shows an operation performed in accordance with the JEDEC standards. As shown in FIG. 5, the Burst Length is 4 and the CAS Latency is 2. Bit lines of the memory cell array 10 is precharged before t0. In the following explanation, the operation described in (t0), for instance, refers to a sequence of operations starting at the time t0.

(t0) A control circuit 31 causes row address buffer register (row buffer) 11 to hold the address AD as RA01. This row address RA01 is decoded by a row decoder 12, which selects one row in the memory cell array 10 and the contents of selected row are then read out on a bit line. The data on the bit line are then amplified by a sense amplifier 13.

(t2) The control circuit 31 causes a column address counter (column buffer) 15 to hold the address AD as CA01. This column address CA01 is decoded by a column decoder 16 and data D00 on the bit line, which correspond to the output from the column decoder 16, are provided to an input/output circuit 30 via a column switching circuit 14. This data D00, is then held at a flip-flop in the input/output circuit 30 for output.

(t4) At the time t4, the data D00 output from the are read from the outside and the control circuit 31 provides a clock to the column address counter 15 to increase the column address. Data D01 on the bit line, which correspond to this column address, are provided to the input/output circuit 30 via the column switching circuit 14. This data D01 is then held at the flip-flop in the input/output circuit 30 for output.

Subsequently, an operation identical to that performed at time t4 is repeated until time t7, and from t4 through t7, continuous 4-word data D00 to D03 are output from the input/output circuit 30.

(t6) In preparation for the next access, bit lines in the memory cell 10 is precharged. As stipulated in the JEDEC standards, during this precharge, the contents of the row address buffer 11 and the column address buffer 16 and the contents of the flip-flop in the input/output circuit 30 are all cleared. However, since one cycle or the clock CLK is extremely short, 10 ns, for instance, the output of data D03 at the time t7 is assured by the propagation delay from the time t6, at which the external signal is received, to the time when said clear is executed.

(t9 to t13) In a manner similar to that in which the operation from t0 through t4 is performed, continuous 4-word data DX0 to DX3 out of one row selected by another word line in the memory cell array 10 of the same bank 0 are output from the input/output circuit 30 at t8 to t12.

As a result, the 5 clock cycles from t8 through t12 become wasted time.

SUMMARY OF THE INVENTION

Accordingly, an object, of the present invention is to provide a memory and a method of reading data out of the memory that can reduce wasted time between random access and sequential access for the same bank in the memory.

In accordance with a first aspect of the present invention, there is provided a memory comprising: a memory cell array having memory cells, word lines each of which being for selecting N memory cells in the memory cells and bit lines for reading a stored data out of the one row memory cells selected; and a data access circuit for performing data access to the memory cell array. The data access circuit includes a register having N storage elements, each of the storage elements corresponding to a pair of the bit lines, respectively, and a column switching circuit for switching ON/OFF between the bit lines and the storage elements corresponding to the bit lines, respectively, for switching ON/OFF between the storage elements and a data bus and for switching ON/OFF between the bit lines and the data bus.

In accordance with a second aspect of the present invention, there is provided a method of reading data out of a memory, comprising the steps of: precharging bit lines; selecting a word line to select N memory cells in a memory cell array and to read out data of the N memory cells onto the bit lines: switching on first switching circuit connected between the bit lines and a register to hold the data on the bit lines in the register; switching off the first switching circuit; precharging the bit lines; selecting and controlling a second switching circuit sequentially, which is connected between the register and a data bus, to read words one-by-one out of the register onto the data bus; selecting a word line during the step of selecting and controlling the second switching circuit; stopping the step of selecting and controlling the second switching circuit; selecting and controlling a third switching circuit, which is connected between the bit lines and the data bus, to read out in response to random access for the memory cell array; stopping the step of selecting and controlling the third switching circuit; and restarting the step of selecting and controlling the second switching circuit.

With the first or second aspect of the invention, wasted time between random access and sequential access for the same bank in the memory can be reduced. Also, the characteristic structure added to the conventional memory is simple enough to prevent production cost from rising. Further, the memory is versatile; it can be used in the same way as a conventional memory and it can also be used in various types of image processing devices which requires a fast serial read.

In a first mode of the first aspect of the invention, the column switching circuit includes: a first switching circuit for switching ON/OFF between the bit lines and the storage elements corresponding to the bit lines, respectively; a second switching circuit for switching ON/OFF between the storage elements and a data bus; and a third switching circuit for switching ON/OFF between the bit lines and the data bus.

In a second mode of the first aspect of the invention, the data access circuit further includes: a column decoder; and a control circuit for selecting and controlling one word of the third switching circuit with an output from the column decoder when reading or writing for the memory cells, for selecting and controlling one word of the second switching circuit with an output from the column decoder when reading data out of the register and for performing simultaneous control of the first switching circuit when writing data on the bit lines to the register.

In a third mode of the first aspect of the invention, the data access circuit further includes: a first column address counter with data inputs connected to an address bus; a second column address counter with data inputs connected to the address bus; a multiplexer for selecting either an output of the first or second column address counter to provide to the column decoder; and a demultiplexer for providing an output from the column decoder to a control input of either the third switching circuit or the second switching circuit: control circuit, when accessing the memory cells, causes the first column address counter to hold an address on the address bus, selects an output of the first column address counter for the multiplexer and selects the third switching circuit for the demultiplexer and, when reading data out of the register, causes the second column address counter to hold an address on the address bus, selects an output of the second column address counter for the multiplexer and selects the second switching circuit for the demultiplexer.

With the third mode, the second aspect of the invention can be implemented easily.

In a fourth mode of the first aspect of the invention, the control circuit causes the row decoder to select one of the word lines to read out data of the memory cells while selecting and controlling the second switching circuit to read data out of the register with the first switching circuit being off.

With the fourth mode, the method of the second aspect can be implemented even more easily.

In a fifth mode of the first aspect of the invention, the control circuit precharges the bit lines while selecting and controlling the second switching circuit to read data out of the register with the first switching circuit being off.

With the fifth mode, wasted time between random access and sequential access for the same bank in the memory can be further reduced.

In a sixth mode of the first aspect of the invention, the memory is a synchronous memory operated in synchronization with a clock.

In a first mode of the second aspect of the invention, when the memory cell array has a plurality of banks, a sequential read operation for one bank is prepared during a sequential read operation for another bank so that a sequential read out of the register is performed continuously from the one bank to the other bank.

With this first mode, even when there is an access request for a bank during a sequential read for the same bank, access can be performed with reducing wasted time over a plurality of banks.

DESCRIPTION OF THE PREFERRED EMBODIMENT

Figure 1:
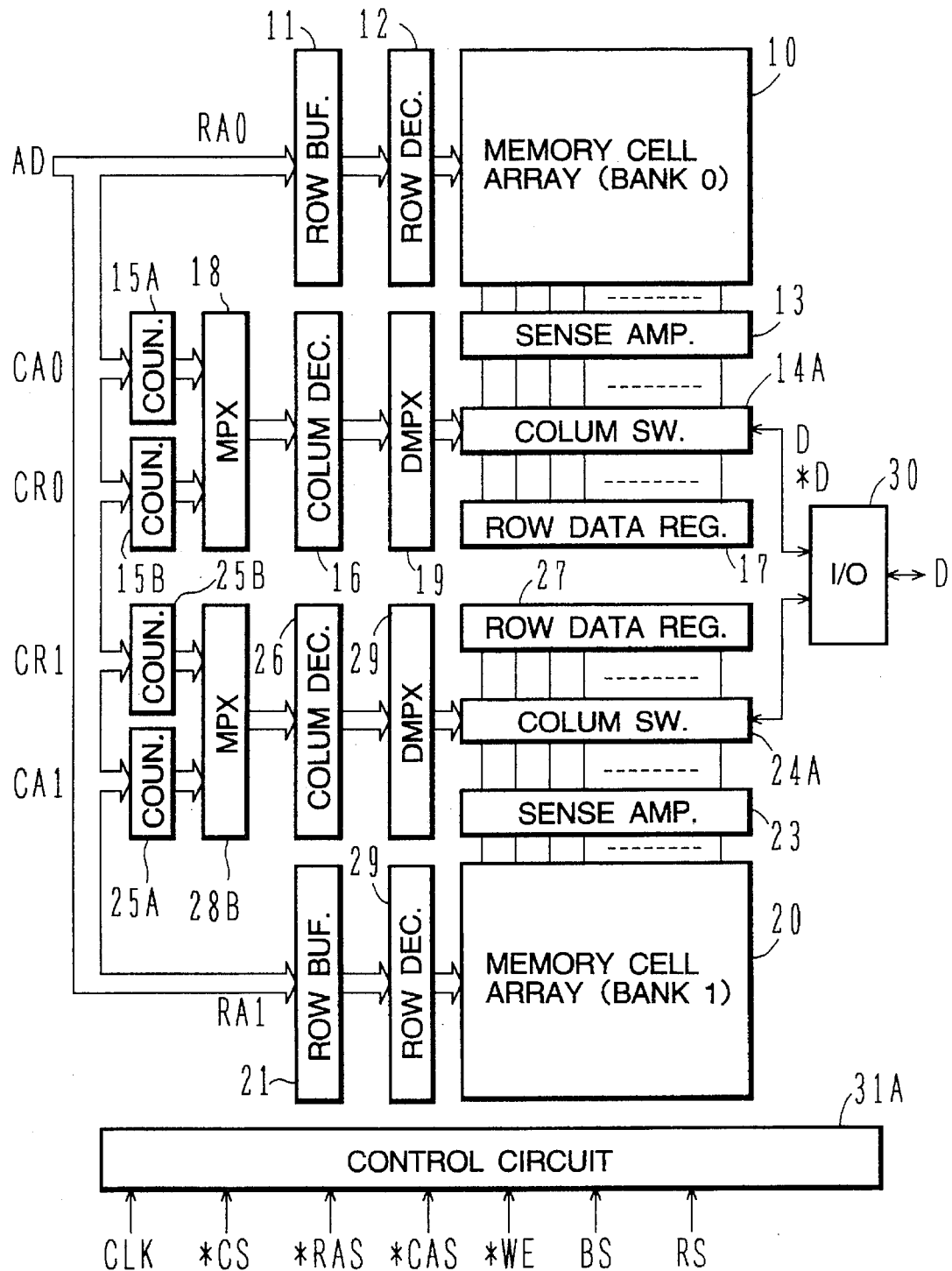
FIG. 1 is a block diagram showing a schematic structure of the synchronous DRAM in an embodiment according to the present invention.

Referring now to the drawings, wherein like reference characters designate like or corresponding parts in several views, an embodiment of the present invention is described below.

FIG. 1 shows the schematic structure of the synchronous DRAW which can be used as VRAM.

This synchronous DRAM is provided with a memory cell array 10 of bank 0 and a memory cell array 20 of bank 1, which have identical structures. The access circuit for the memory cell array 10 and the access circuit for the memory cell array 20 have symmetrical structures. The following is an explanation of the circuit of bank 0.

The address AD on the address bus is held in a row address buffer register 11 as RA0 and the RA0 thus held is decoded by a row decoder 12 and one word line in the memory cell array 10 is selected.

Figure 2:
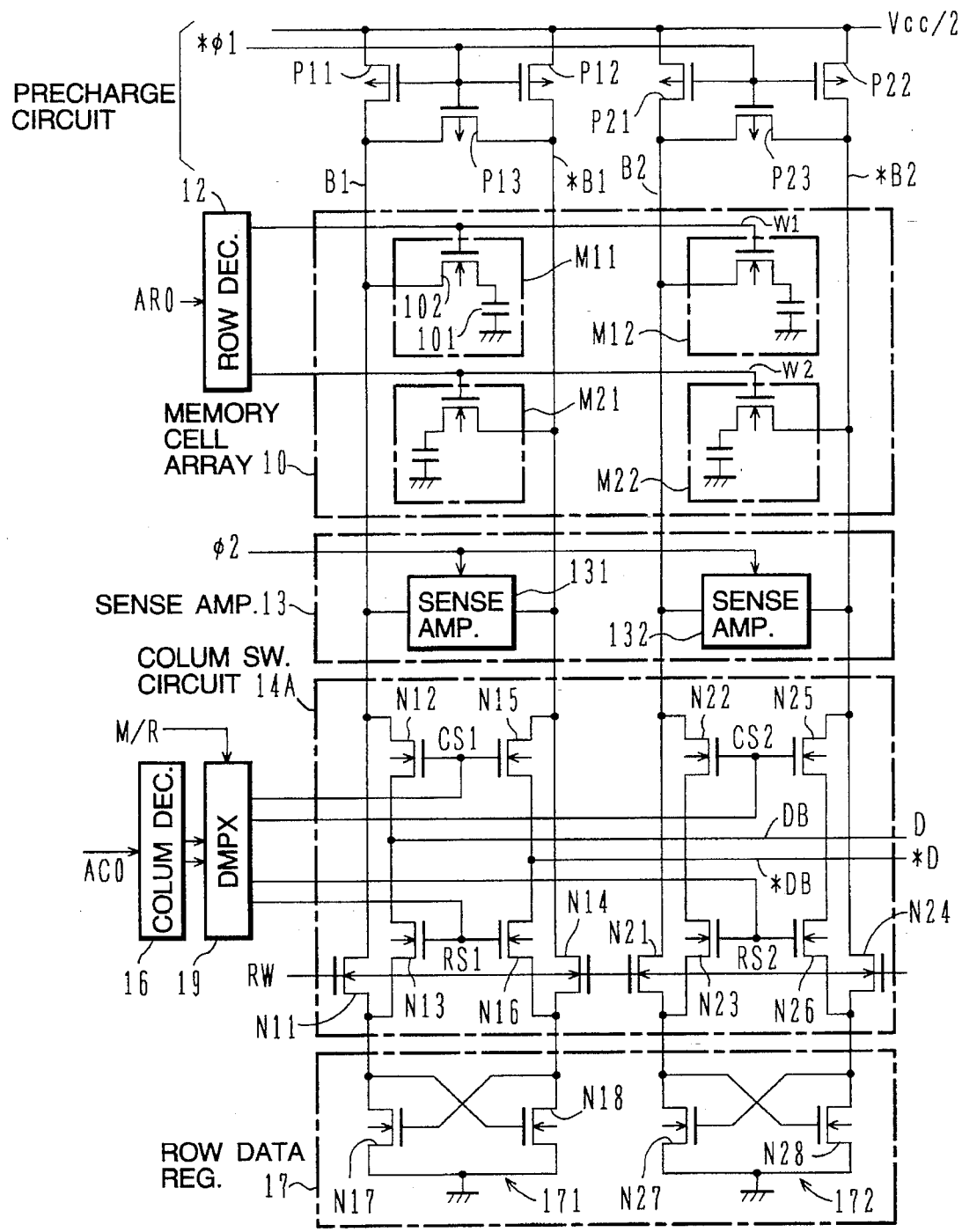
FIG. 2 is a circuit diagram of bank 0 in FIG. 1 when a memory cell array is simplified to 2-row, 2-column memory cells.

For the sake of simplifying the explanation, FIG. 2 shows a construction in which the memory cell array 10 is simplified to 2-row, 2-column memory cells M11 to M22. In each memory cell, one end of the MOS capacitor 101 is connected to the ground line, another end is connected to bit line B1 via an nMOS transistor 102 and a gate of the nMOS transistor 10 is connected to a word line W1. The memory cells M11 and M12 in odd numbered rows are connected to the bit lines B1 and B2, respectively, and the memory cells M21 and M22 in even numbered rows are connected to the bit lines *B1 and *B2, respectively.

One end of each of the bit lines B1 and *B1 is connected to a precharge circuit (not shown in FIG. 1) and another end of each of the hit lines B1 and *B1 is connected to a row data register 17 via a sense amplifier 13 and a column switching circuit 14A. These components, i.e., the precharge circuit, the sense amplifier 13, the column switching circuit 14A and the row data register 17 are structured identically for each column of the memory cell array 10.

In the first column of the precharge circuit, one end or the bit lines B1, *B1 is connected to a line of a constant potential VCC/2 via the pMOS transistors P11 and P12, respectively, and a pMOS transistor P13 for equalizing potential of the bit lines B1 and *B1 is connected between the bit line B1 and the bit line *B1. The gates of the pMOS transistors P11 to P13 are to each other connected and a precharge signal *φ1 is provided to them. The second column of the precharge circuit comprises pMOS transistors P21 to p23.

The first column or the sense amplifier (group) 13 is constituted with a sense amplifier 131, which amplifies the potential difference between the bit lines B1 and *B1 to cause it to swing fully between the power supply potential VCC and 0V. The sense amplifier 131 is set in the operating/non operating states by an enable signal φ2 provided from a control circuit 31A. The second column of the sense amplifier 13 is constituted with a sense amplifier 132.

In the first column of the column switching circuit 14A, one end of each of nMOS transistors N11 and N12 is connected to another end of the bit line B1 and another end of the nMOS transistor N12 is connected to both a data bus line DB and another end of the nMOS transistor N11 via an nMOS transistor N13. Likewise, one end of each of nMOS transistors N14 and N15 is connected to another end of the bit line *B1 and another end of the nMOS transistor N15 is connected to both a data bus line *DB and another end of the nMOS transistor N14 via an nMOS transistor N16. The gates of the nMOS transistors N12 and N15 are connected to each other and a column selection signal CS1 is provided to them. The gates of the nMOS transistors N13 and N16 are connected to each other and a register bit selection signal RS1 is provided to them. Also, the gates of the nMOS transistors N11 and N14 are connected to each other and a register write signal RW is provided to them. The second column of the column switching circuit 14A is constituted with nMOS transistors N22 to N26 and, a column selection signal CS2 is provided to the gates of the nMOS transistors N22 and N25, a register bit selection signal RS is provided to the gates of the nMOS transistors N23 and N26 and a register write signal RW is provided to the gates of the nMOS transistors N21 and N24.

The first column of the row data register 17 is constituted with a flip-flop 171, in which the sources of nMOS transistors N17 and N18 are both connected to the ground line, the drain of the nMOS transistor N17 is connected to the gate of the nMOS transistor N18 and the drain of the nMOS transistor N18 is connected to the gate of the nMOS transistor N17. The drains of the nMOS transistors N17 and N18 are connected to other ends of the nMOS transistors Nil and N14 respectively. Parasitic capacitances, which contribute to data holding, are present between the gates of the nMOS transistors N17, N18, and the ground line. The second column of the row data register 17 is constituted with a flip-flop 172 and comprises nMOS transistors N27 and N28.

in FIG. 1, the address AD on the address bus is loaded into a column address counter 15A as CA0 when the register selection signal *RS is set to high and is loaded into a column address counter 15B as CR0 when the register selection signal *RS is set to low. Then, whichever of the loaded column addresses CA0 and CR0 is selected by a multiplexer 18 to be decoded by a column decoder 16. The results of decoding are provided to the column switching circuit 14A as column selection signal CS1 and column selection signal CS2 via the demultiplexer 19 when a memory/register selection signal M/R, which is provided to the control input terminal of the demultiplexer 19, is set high. The results of decoding are provided to the column switching circuit 14A as register bit selection signals RS1 and RS2 when the memory/register selection signal M/R is set to low.

The data bus lines DB and *DB are both connected to the input/output circuit 30. The input/output circuit 30 is provided with a flip-flop for holding the data on the data bus lines DB and *DB and a sense amplifier for amplifying the potential difference between the data bus lines DB and *DB before holding (not shown).

The control circuit 31A is provided with a mode register, as in the prior art, and the Burst Length, Wrap Type and CAS Latency can be set. It is also provided with a self-refresh circuit for the memory cell arrays 10 and 20.

The control circuit 31A controls the components of the memory access circuit based upon a clock CLK, a chip select signal *CS, a row address strobe signal *RAS, a column address strobe signal *CAS, a write enable signal *WE a bank selection signal BS and a register selection signal *RS provided from the outside. The control circuit 31A outputs a series of control signals starting from the rise of the lock CLK when the chip select signal *CS is set to low.

The bank selection signal BS is the most significant bit of the address. When it is set low, bank 0 is selected and when it is set high, bank 1 is selected. When the register selection signal *RS is set low, it indicates a row register access request and when is set high, it indicates a memory access request.

When the row address strobe signal *RAS is set low and the column address strobe signal *CAS is set high, the address AD is held in the row address buffer register 11 with the timing of the rising edge of the clock CLK. Then a data readout operation onto the bit line and an amplifying operation by the sense amplifier 13 are performed. In addition, when the register selection signal *RS is set low, a write to the row data register 17 is also performed.

When the row address strobe signal *RAS is set high and the column address strobe signal *CAS is set low, the address AD is held in the column address counter 15A or 15B with the timing of the rising edge of the clock CLK. Then for a data on the bit lines, a data readout operation or a data write operation is performed, depending upon whether the write enable signal *WE is set to high or low when the register selection signal *RS is set to high. When the register selection signal *RS is set to low, a readout operation From the row data register 17 is performed.

Figure 5:
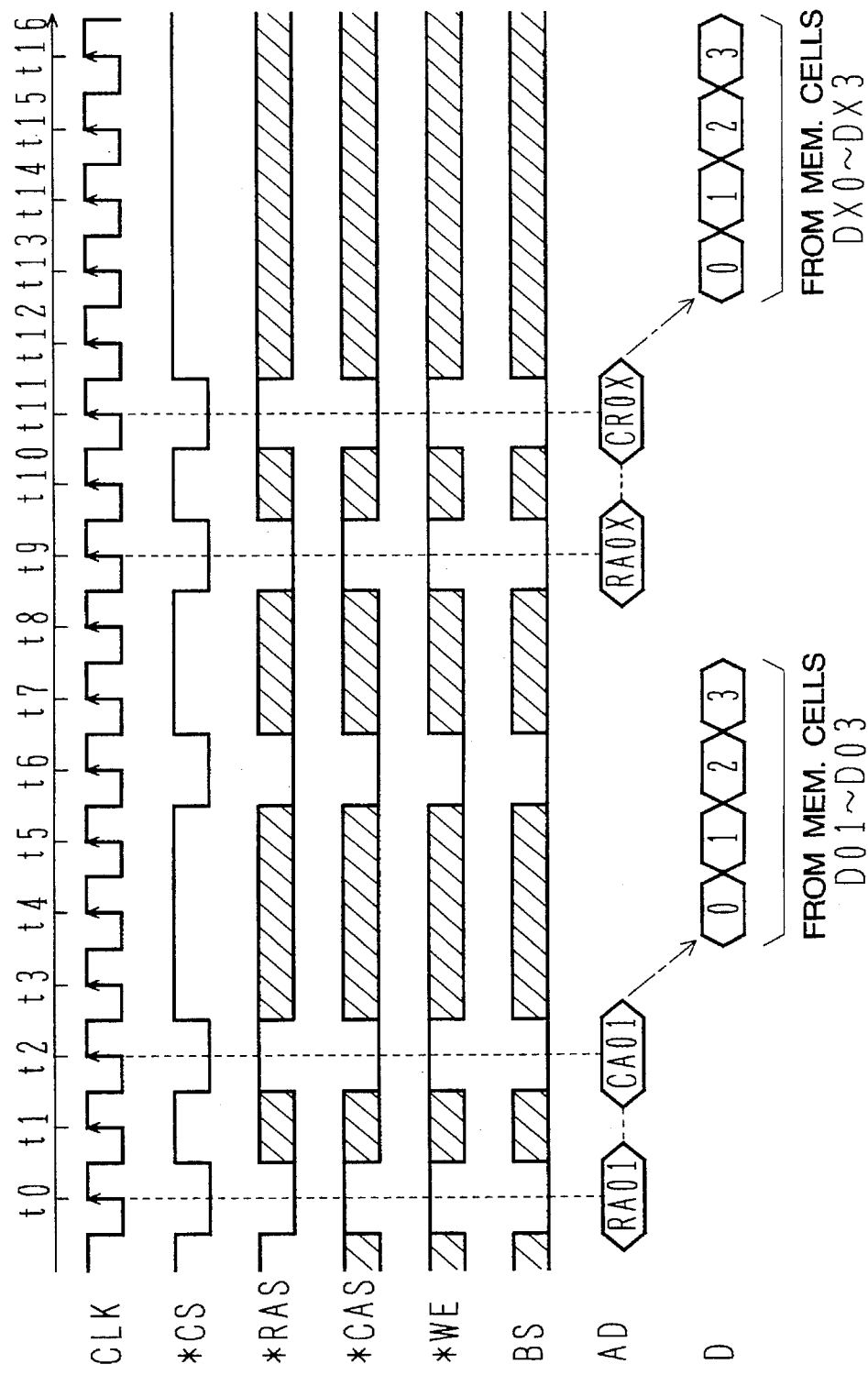
FIG. 5 is a timing ciagram showing an example of operation performed by the synchronous DRAM in FIG. 4.

The control circuit 31A performs control operations in accordance with the JEDEC standards, in which, when the row address strobe signal *RAS and the column address strobe signal CAS are both set to low, as they are at the time 16 in FIG. 5, a precharge is performed. Furthermore, although this is not in the standards, a precharge is also performed at the time t2, which is to be explained later.

Figure 3:
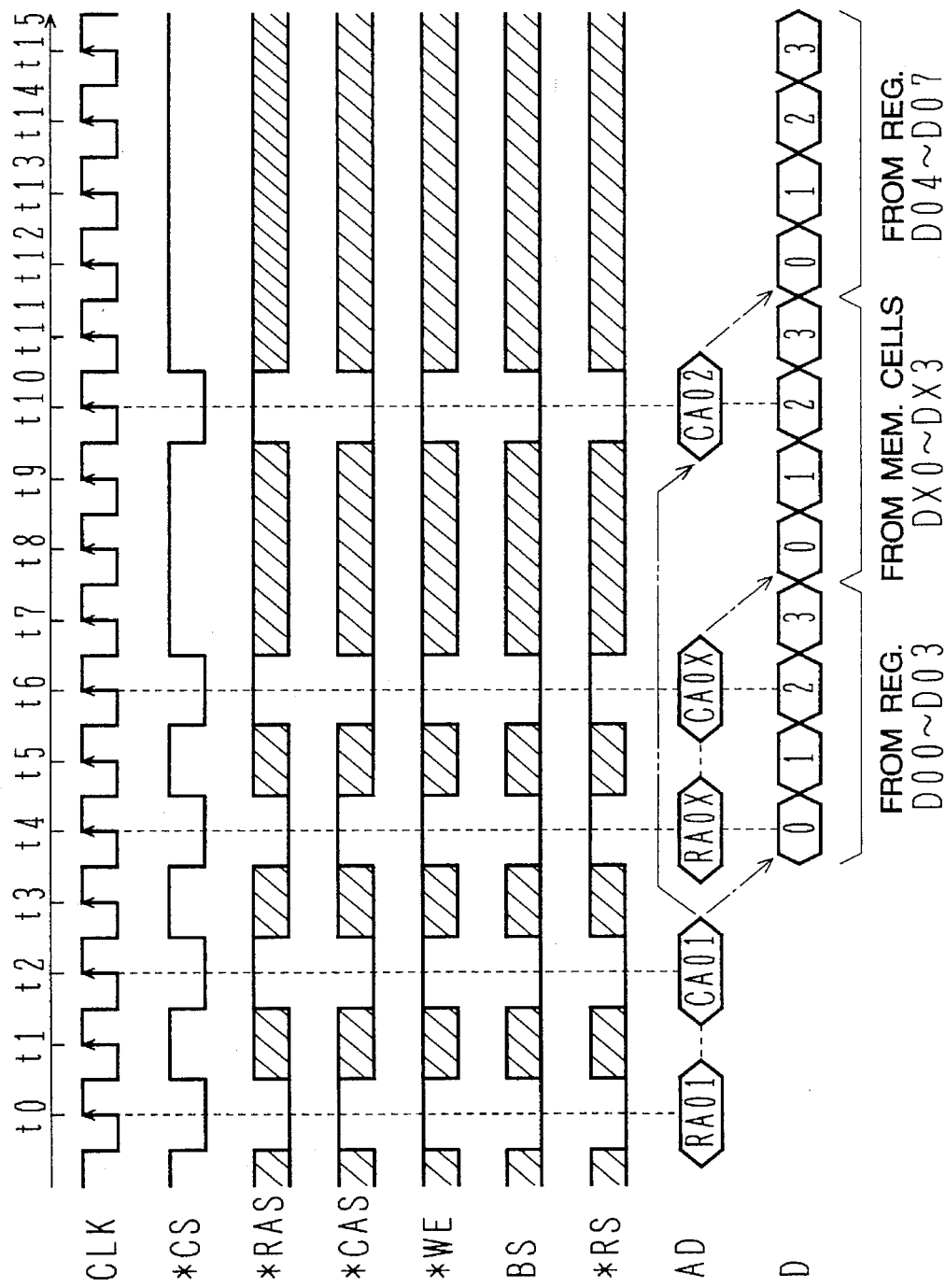
FIG. 3 is a time chart showing an example of operation performed by the synchronous DRAB in FIG. 1.

Next, an example of an operation performed by the synchronous DRAM is explained in reference to FIG. 3.

In this example, the synchronous DRAM is used as VRAM and data of one row in the memory cell array 10 are held in the row data register 17. The data thus held in the row data register 17 are read out one-by-one bit sequentially and then are provided to a video signal generating circuit (not shown) via the input/output circuit 30. If there is a random access request issued by the application program to the memory cell array 10 during this sequential read, the request is received and a data readout or a data write is performed. When this random access request is issued for the bank where the sequential read is in progress, wasted time represents a problem. FIG. 3 shows a part of such a situation. In FIG. 3, the Burst Length is 4 and the CAS Latency is 2

The bit line of the memory cell array 10 is precharged before the time t0. In the following explanation, the operation at (t0), for instance, refers to a sequence of operations starting at the time t0.

(t0) Since the chip select signal *CS is set low, the row address strobe signal *RAS is set low, the column address strobe signal *CAS is set high and the bank selection signal BS is set low, the address AD is held in the row address buffer register 11 as RA01 and the contents of the row selected by the row decoder 12 are read out onto the bit lines. Next, the sense amplifier 13 is set in the operating state by the enable signal $\phi 2$ and the data on the bit line are amplified by the sense amplifier 13. Furthermore, as the register selection signal ,RS is set low and the write enable signal *WE is set high at the time t0, the register write signal RW is set high to turn ON the nMOS transistors N11, N14, N21 and N24, and data on the bit lines are held in the row data register 17.

(t2) Since the chip select signal *CS is set low, the row address strobe signal *RAS is set high, the column address strobe signal *CAS is set low, the write enable signal *WE is set high, the bank selection signal BS is set low, the register selection signal *RS is set low, and the Burst Length is 4 as mentioned earlier, control for a continuous read of 4-word data (in this embodiment, 1 word=1 bit) out of the row data register 17 is performed in the following manner:

First, the address AD is held in the column address counter 15B as CA01 and the output of the column address counter 15B is selected for the multiplexer 18. Additionally, the memory/register selection signal M/R is set low and the register bit selection signal RS1 is set high in FIG. 2 so that the data held in flip-flop 171 is read out from the data bus lines DB and *DB via the nMOS transistors N13 and N16. Specific airy, the first bit of the row data register 17 is selected for the column switching circuit 14A and the data D00 on the data bus lines DB and *DB is held at the flip-flop in the input/output circuit 30.

In preparation for the next access to the memory cell array 10, the bit lines in the memory cell array 10 are precharged. That is, when a read command (the row address strobe signal *RAS is set high, the column address strobe signal *CAS is set low, and the write enable signal *WE is set high) is issued for the row data register 17 (the register selection signal *RS is set high), a precharge is also specially performed for the bit lines for the bank indicated by the bank selection signal BS. However, in such a case, the contents of the row and column address buffers 11, 15A and 15B, and also the contents of the flip-flop in the input/output circuit 30 are not cleared. This precharge is made possible since, at the time t2, the nMOS transistors N11, N14, N21, N24, N12, N15, N22 and N25 are turned OFF.

(t4) The data D00 output from the DRAM are read from the outside at the time t4.

A clock is provided to the column address counter 15B to increase the column address, the second bit of the row data register 17 is selected for the column switching circuit 14A and the data D01 on the data bus lines DB and *DB is held at the flip-flop in the input/output circuit 30.

(t5 to t7) The operation performed at the time (t4) described above is repeated from t5 through t7 and the data D01 to D03 from the row data register 17 are read out in synchronization with the clock CLK.

The following operation is also performed from time t4 through the time t7. Such concurrent operation is made possible since, as mentioned earlier, the nMOS transistors N11, N14, N21, N24 , N12, N15, N22 are N25 are OFF.

(t4) Since the chip select signal *CS is set to low, the row address strobe signal *RAS is set low, the column address strobe signal *GAS is set high, the bank selection signal BS is set low and the register selection signal *RS is set high, the address AD is held in the row address buffer register 11 as RAOX and the contents of the row selected by the row decoder 12 are read out onto the bit lines. Next, the sense amplifier 13 is set in an operating state by an enable signal $\phi 2$ and the data on the bit lines are amplified by the sense amplifier 13.

(t6) Since the chip select signal *CS is set low, the row address strobe signal *RAS is set high, the column address strobe signal *CAS is set low, the write enable signal *WE is set high, the bank selection signal BS is set low, the register selection signal *RS is set high, and, as mentioned earlier, the Burst Length is 4, i.e., since a random read request for continuous 4-words is being issued from the application program to the memory cell array 10 of bank 0, control for a random read of continuous 4-word data out of the memory cell array 10 is performed in the following manner:

First, the address AD is held in the column address counter 15A as CAOX. After the data D03 is held at the flip-flop in the input/output circuit 30, the output of the column address counter 15A is selected for the multiplexer 18. Next, the memory/register selection signal 2 is set high so that the data DX0, which is the selected one bit of the one row selected by the row decoder 12 and amplified by the sense amplifier 13, are read out from the data bus lines DB and *DB, and then it is held at the flip-flop in the input/output circuit 30.

(t8) The data DX0 output from the DRAM are read from the outside at the time t8.

A clock is provided to the column address counter 15A to increase the column address, and the data DX1 on the data bus lines DB and *DB is held at the flip-flop in the input/output circuit 30.

(t9 to t11) The operation performed at the time (t8) described above is repeated from t9 through t11 and the data DX1 to DX3 from the memory cell array 10 are read out in synchronization with the clock CLK.

(t10) Since the chip select signal *CS is set low, the row address strobe signal *RAS is set high, the column address strobe signal *GAS is set low, the write enable signal *WE is set high, the bank selection signal BS is set low and the register selection signal *RS is set low, control for a continuous read of 4-word data out of the row data register 17 is performed (i.e., the sequential read control of the row data register 17 resumes) in the following manner:

First, the address AD is held in the column address counter 15B as CA02. After the data DX03 are held at the Flip-flop in the input/output circuit 30, the output of the column address counter 15B is selected for the multiplexer 18. Also, the memory/register selection signal M/R is set low in FIG. 2, to select the bit in the row data register 17 for the column switching circuit 14A so that the data DO4 is read out onto the data bus lines DB and *DB. Then, it is held at the flip-flop in the input/output circuit 30.

Since the command issued at the time t10 is identical to that issued at the time t2, explained earlier, the precharge described earlier is also performed here. As mentioned in (t6), in the background of the invention, the output of the data DX3 is assured due to signal propagation delay.

(t12) Data D04 output from the DRAM are read from the outside at the time t12.

A clock is provided to the column address counter to increase the column address, the next bit in the row data register 17 is selected for the column switching circuit 14A and the data D05 on the data bus lines DB and *DB are held at the flip-flop in the input/output circuit 30.

(t13 to t15) The operation performed at the time (t12) described above is repeated from t13 through t15 and the data D05 to D07 from the row data register 17 are read out in synchronization with the clock CLK.

As has been explained so far, access can be performed continuously even when a random access request is issued for the same bank while control for a sequential read is being performed in synchronization with the clock CLK, reducing wasted time. Namely, wasted time between random access and sequential access for the same bank in the memory can be reduced more than that of the prior art.

By starting a sequential read control for bank 1 in a manner identical to that for bank 0, 4 cycles before the data for all the bits are read out from the row data register 17, the sequential read control from bank 0 to bank 1 is performed without break, arid such control is repeated in linear sequence.

Since the sequential read is performed for the row data register 17, it is riot necessary to perform a refresh operation for the row data register 17.

The synchronous DRAM in this embodiment provides versatility since it can be used as ordinary synchronous DRAM as in the prior art when a sequential read is not being performed and can also be used in various types of image processing devices. In addition, the characteristic structure added to ordinary synchronous DRAM is simple enough to prevent production cost from rising.

Although a preferred embodiment of the present invention has been described, it is to be understood that the invention is not limited thereto and that various changes and modifications may be made without departing from the spirit and scope or the invention.

Figure 4:
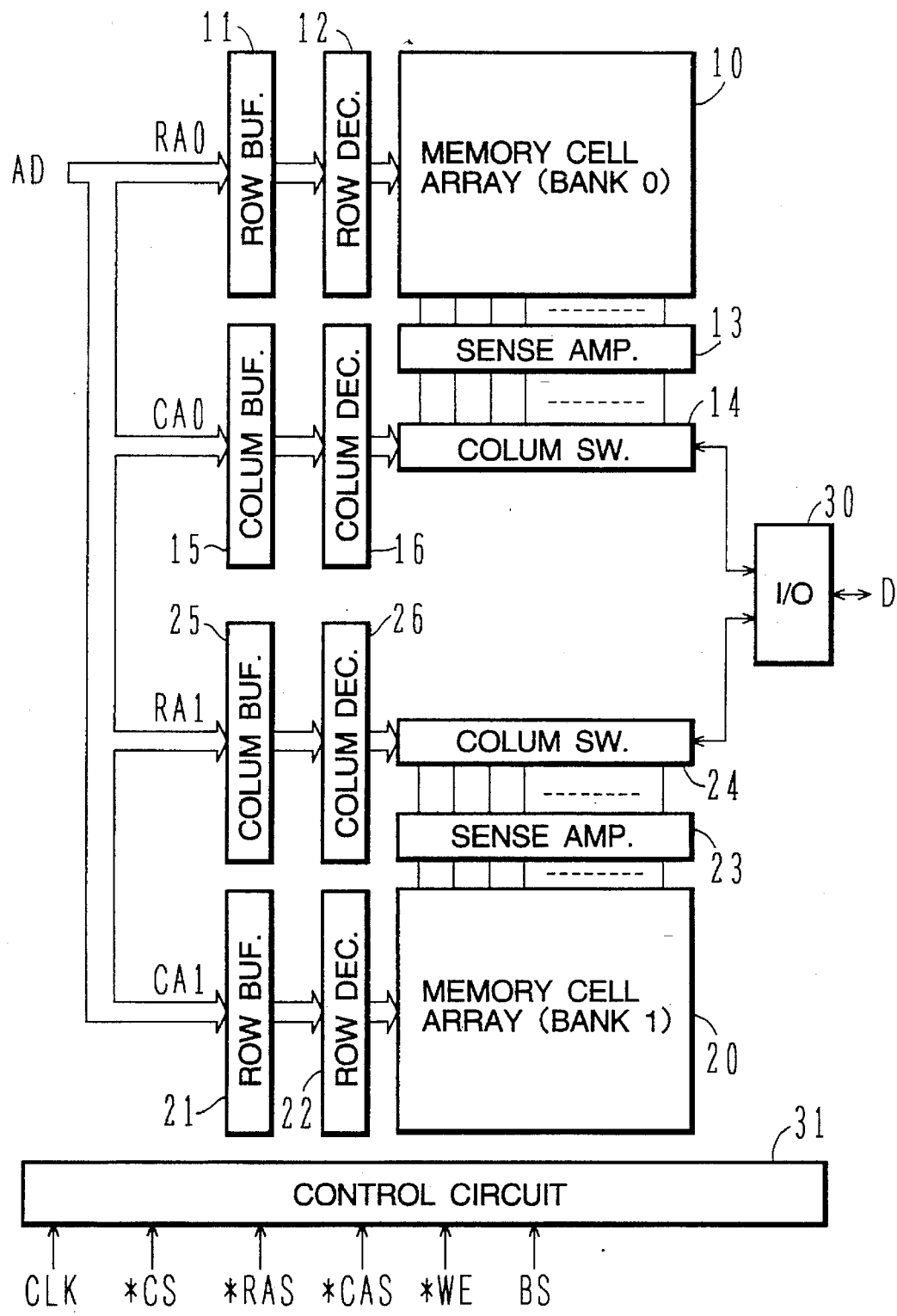
FIG. 4 is a block diagram showing a schematic structure of a synchronous DRAM in the prior art.

For instance, in the embodiment described above, the command issued at the time t2, which is a combination of external signals at the time t2 in FIG. 3, is both a register read command and a special precharge command. However, a variation is possible wherein the special precharge command is not included. In that case, the operation performed is identical to that shown in FIG. 5 within the time span corresponding to that in FIG. 3, and it will become necessary to provide a precharge command at the time t6. There will also be 5 clock cycles of wasted time generated. Still, in the structure shown in FIG. 4, during operations subsequent to that shown in FIG. 5, when data D04 to D07 are read out of the memory cell array 10, wasted time will be generated similar to that generated from t8 through t12 in FIG. 5. In contrast, in the variation described above, the sequential read operation For the register 17 is performed during the time t0 through t7 instead of random read operation For the memory cells, and an operation that is identical to the register read operation at the time t10 in FIG. 3 can be performed at the time t15 in FIG. 5 concurrently with the random read operation for the memory cells. This makes it possible to read out data continuously from the register 17 from a time t17 (not shown), achieving the advantages of the present invention.

Also, for the sake of simplification, the explanation has been given on the premise that the synchronous DRAM outputs one bit, i.e., one word equals one bit, but the present invention may take a structure with a plurality of bits being output in parallel. In such a case, the structure of the plurality of bits being output in parallel from the row data register 17 in the column switching circuit 14A may be identical to the structure of the plurality of bits being output in parallel from the memory cell array 10 as is prior art.

Moreover, the row data register 17 may be structured identically to the memory cells in the memory cell array 10.

Furthermore, similar advantages can be achieved when the present invention is applied to a memory of single bank structure, a general RAM or a ROM.

Although the present invention has been described in its preferred embodiments, it is to be understood that the invention is not limited thereto and that various changes and modifications may be made without departing from the spirit and scope of the invention.

What is claimed is:

1. A memory comprising:

a memory cell array having memory cells, word lines each of which being for selecting N memory cells in said memory cells and bit lines for reading a stored data out of said one row memory cells selected; and a data access circuit for performing data access to said memory cell array, said data access circuit includes:

a register having N storage elements, each of said storage elements corresponding to a pair of said bit lines respectively; and a column switching circuit for switching ON/OFF between said bit lines and said storage elements corresponding to said bit lines, respectively, for switching ON/OFF between said storage elements and a data bus and for switching ON/OFF between said bit lines and said data bus.

2. A memory according to claim 1, wherein said column switching circuit includes:

a first switching means for switching ON/OFF between said bit lines and said storage elements corresponding to said bit lines, respectively;

a second switching means for switching ON/OFF between said storage elements and a data bus; and a third switching means for switching ON/OFF between said bit lines and said data bus.

3. A memory according to claim 2, wherein said data access circuit further includes:

a column decoder; and a control circuit for selecting and controlling one word of said third switching means with an output from said column decoder when reading and writing for said memory cells, for selecting and controlling one word of said second switching means with an output from said column decoder when reading data out of said register and for performing simultaneous control of said first switching means when writing data on said bit lines to said register.

4. A memory according to claim 3, wherein said data access circuit further includes:

a first column address counter with data inputs connected to an address bus;

a second column address counter with data inputs connected to said address bus;

a multiplexer for selecting either an output of said first or second column address counter to provide to said column decoder; and a demultiplexer for providing an output from said column decoder to a control input of either said third switching means or said second switching means: and wherein said control circuit, when accessing said memory cells, causes said first column address counter to hold an address on said address bus, selects an output of said first column address counter for said multiplexer and selects said third switching means For said demultiplexer and, when reading data out of said register, causes said second column address counter to hold an address on said address bus, selects an output of said second column address counter for said multiplexer and selects said second switching means for said demultiplexer.

5. A memory according to claim 4, wherein said data access circuit further includes a row decoder for selecting one of said word lines; and wherein said control circuit causes said row decoder to select one of said word lines to read out data of said memory cells while selecting and controlling said second switching means to read data out of said register with said first switching means being off.

6. A memory according to claim 5, wherein said control circuit precharges said bit lines while selecting and controlling said second switching means to read data out of said register with said first switching means being off.

7. A memory according to claim 1, wherein said memory is a synchronous memory operated in synchronization with a clock.

8. A method of reading data out of a memory, comprising the steps of:

precharging bit lines;

selecting a word line to select N memory cells in a memory cell array and to read out data or the N memory cells on to the bit lines;

switching on first switching means connected between the bit lines and a register to hold the data on the bit lines in the register;

switching off the first switching means;

precharging the bit lines;

selecting and controlling second switching means sequentially, which is connected between the register and a data bus, to read one by one word out of the register on to the data bus;

selecting a word line during said step of selecting and control ting the second switching means;

stopping said step of selecting and controlling the second switching means;

selecting and controlling third switching means, which is connected between the bit lines and the data bus, to read out in response to random access for the memory cell array;

stopping said step of selecting and controlling the third switching means; and restarting said step of selecting and controlling the second switching means.

9. A method of reading data out of a memory according to claim 8, wherein, when the memory cell array have a plurality of banks, a sequential read operation for one bank is prepared during a sequential read operation for an other bank so that a sequential read out of the register is performed continuously from the one bank to the other bank.

* * * * *